(12) United States Patent
Lanzerotti

(10) Patent No.: US 9,230,050 B1
(45) Date of Patent: Jan. 5, 2016

(54) SYSTEM AND METHOD FOR IDENTIFYING ELECTRICAL PROPERTIES OF INTEGRATE CIRCUITS

(71) Applicant: The United States of America, as represented by the Secretary of the Air Force, Washington, DC (US)

(72) Inventor: Mary Y. Lanzerotti, New Vernon, NJ (US)

(73) Assignee: The United States of America, as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/484,941

(22) Filed: Sep. 12, 2014

Related U.S. Application Data

(60) Provisional application No. 62/049,251, filed on Sep. 11, 2014.

(51) Int. Cl.
*G06F 9/455* (2006.01)
*G06F 17/50* (2006.01)

(52) U.S. Cl.
CPC ........ *G06F 17/5072* (2013.01); *G06F 17/5045* (2013.01); *G06F 17/5081* (2013.01)

(58) Field of Classification Search
USPC .................................. 716/111, 112, 113, 139
See application file for complete search history.

(56) References Cited

U.S. PATENT DOCUMENTS

| | | | |
|---|---|---|---|
| 4,251,160 A | 2/1981 | Bouwhuis et al. | |
| 4,388,386 A | 6/1983 | King et al. | |
| 4,698,787 A | 10/1987 | Mukherjee et al. | |
| 4,827,428 A | 5/1989 | Dunlop et al. | |
| 5,051,938 A | 9/1991 | Hyduke | |
| 5,278,769 A * | 1/1994 | Bair et al. | 703/19 |
| 5,666,288 A | 9/1997 | Jones et al. | |
| 5,805,861 A | 9/1998 | Gilbert et al. | |
| 5,923,430 A | 7/1999 | Worster et al. | |
| 6,185,707 B1 | 2/2001 | Smith et al. | |
| 6,628,333 B1 | 9/2003 | Gowda et al. | |
| 6,751,765 B1 | 6/2004 | Rizzolo et al. | |
| 6,907,583 B2 | 6/2005 | Abt | |

(Continued)

OTHER PUBLICATIONS

J.Friedrich; et al. "Design of the Power6 Microprocessor," Proc. Intl. Solid-State Circuits Conference, San Francisco, CA 2007, paper 5.1.

(Continued)

*Primary Examiner* — Brian Ngo
(74) *Attorney, Agent, or Firm* — AFMCLO/JAZ; James P. Carey

(57) ABSTRACT

A new method for displaying electrical properties for integrated circuit (IC) layout designs provides for improved human visualization of those properties and comparison of as designed layout design parameters to as specified layout design parameters and to as manufactured layout parameters. The method starts with a circuitry as designed layout in a first digital format, extracts values for electrical properties from that circuitry as designed layout then annotates those values back into the first digital format. The annotated circuitry as designed layout is then converted from the first digital format to a second digital format that can be converted to a raster scan image of the extracted and annotated electrical property values superimposed at their corresponding physical locations onto a physical layout image of the integrated circuit, preferably color-coded to further spotlight potential defects. The visual images are compared to as specified layout design parameters and to as manufactured parameters.

2 Claims, 9 Drawing Sheets

(56) References Cited

U.S. PATENT DOCUMENTS

| | | | |
|---|---|---|---|
| 7,103,863 | B2 | 9/2006 | Riepe et al. |
| 7,171,346 | B1 | 1/2007 | Recker et al. |
| 7,260,810 | B2 | 8/2007 | Filippi, Jr. et al. |
| 7,284,230 | B2 | 10/2007 | Bergman Reuter et al. |
| 7,346,470 | B2 | 3/2008 | Wisniewski et al. |
| 7,389,480 | B2 | 6/2008 | Allen et al. |
| 7,418,683 | B1 | 8/2008 | Sonnard et al. |
| 7,472,364 | B2 | 12/2008 | Lehner et al. |
| 7,475,368 | B2 | 1/2009 | Angyal et al. |
| 7,574,682 | B2 | 8/2009 | Riviere-Cazaux |
| 7,661,081 | B2 | 2/2010 | Allen et al. |
| 7,721,237 | B2 | 5/2010 | Scheffer et al. |
| 7,752,581 | B2 | 7/2010 | Lanzerotti et al. |
| 7,784,008 | B1 * | 8/2010 | Hutton et al. .................. 716/126 |
| 7,827,519 | B2 | 11/2010 | Scheffer et al. |
| 7,900,178 | B2 | 3/2011 | Culp et al. |
| 7,962,866 | B2 | 6/2011 | White et al. |
| 8,122,387 | B2 | 2/2012 | Han et al. |
| 8,146,032 | B2 | 3/2012 | Chen et al. |
| 8,209,650 | B2 * | 6/2012 | St. John et al. ............... 716/111 |
| 8,539,427 | B2 | 9/2013 | Lu |
| 8,732,640 | B1 * | 5/2014 | Krishnan et al. ............. 716/110 |
| 2002/0078412 | A1 | 6/2002 | Wang et al. |
| 2005/0066301 | A1 | 3/2005 | Lorenz et al. |
| 2005/0202326 | A1 | 9/2005 | Gordon et al. |
| 2006/0053357 | A1 | 3/2006 | Rajski et al. |
| 2006/0066338 | A1 | 3/2006 | Rajski et al. |
| 2006/0265185 | A1 | 11/2006 | Lanzerotti et al. |
| 2008/0033996 | A1 * | 2/2008 | Kesari ........................ 707/104.1 |
| 2008/0115028 | A1 | 5/2008 | Homer et al. |
| 2008/0282211 | A1 | 11/2008 | Culp et al. |
| 2012/0304146 | A1 * | 11/2012 | Jiang et al. .................... 716/139 |
| 2013/0021048 | A1 | 1/2013 | Peng et al. |

OTHER PUBLICATIONS

B. Stolt et al. "Design and Implementation of the POWER6 Microprocessor," IEEE Jnl. Solid-State Circuits, vol. 43, No. 1, pp. 21-28, Jan. 2008.

M.Y.L. Wisniewski [Lanzerotti] et al. "The Physical Design of On-Chip Interconnections," IEEE Trans. Cad, vol. 22, No. 3, Mar. 2003, pp. 254-276.

M. Rowe et al. "Cell-aware ATPG test methods improve test quality," EDN, Jun. 1, 2012, 8 pages, http://www.edn.com/designitest-and-measurement/4389613/Cell-aware-ATPG-test-methods-improve-test-quality.

B. Ackland et al. "Functional Verification in an Interactive Symbolic IC Design Environment," Caltech Conference on VLSI (Computer-Aided Design Session), Jan. 1981, pp. 285-298.

* cited by examiner

SYSTEM AND METHOD FOR IDENTIFYING ELECTRICAL PROPERTIES OF INTEGRATE CIRCUITS

CROSS REFERENCE TO RELATED PATENT APPLICATIONS

This application claims priority under 35 U.S.C. §119(e) from U.S. provisional application 62/049,251, filed Sep. 11, 2014, and titled "System and Method for Identifying Electrical Properties of Integrated Circuits." The invention description contained in that provisional application is incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to methods for identifying, during the design stage of integrated circuits (ICs) and semiconductor wafers, electrical properties likely to cause defects in those devices when manufactured, and more specifically to visually displaying those potential defects such that they are more easily identified.

Integrated circuit design can be divided into three stages: circuitry as specified, circuitry as designed and circuitry as manufactured.

Circuitry as specified is a somewhat abstracted circuit design made with knowledge of the latest state of the art integrated circuit manufacturing capabilities. It represents what a designer wants the chip to do. The final output of the circuitry as specified process typically is a register transfer level (RTL) description, or RTL design.

Circuitry as designed is a computer generated representation of the physical layout of an IC designed to achieve the goals of the circuitry as specified design. It's typically developed using such computer tools as CADENCE software. The final output of the circuitry as designed process is a so-called tapeout file ready to be sent to an IC foundry to be made into physical ICs.

Circuitry as manufactured is, of course, final manufactured ICs.

Because both circuitry as specified and circuitry as designed stages are performed pushing the envelope, so to speak, of then latest state of the art IC manufacturing capabilities, defects, both actual and potential, often occur. It's desirable, of course, to detect those defects as early in the design process as possible, preferably during the circuitry as designed stage and not after the circuitry as manufactured stage.

Unfortunately, when commercially available additional software is applied to the circuitry as designed process to identify resulting electrical properties, the output files typically are huge ASCII files suitable for printing only on numerous sheets of 14 inch perforated green bar paper. They are both difficult to read and overwhelming.

U.S. Pat. No. 7,260,810 to Filippi, Jr., et al. describes analyzing circuitry as designed designs by discretizing a design structure into pixel elements representative of the physical design structure and determining at least one physical structural property from each pixel element. Each pixel element corresponds generally to a portion of an IC chip area. The Filippi, Jr., et al. invention is very broadly described, including many broadly claimed variations, but with very little description of any details required to implement either its most general description or any of the claimed variations.

Related U.S. Pat. No. 7,346,470 to Wisniewski (now Lanzerotti) et al. and U.S. Pat. No. 7,752,581 to Lanzerotti et al. describe methods for identifying high risk factors in circuit design data, including by correlating actual defects in as manufactured ICs and semiconductor wafers with original circuit design data.

The two Lanzerotti et al. patents do not describe how to then best use that information for spotlighting those high risk factors in circuit design data during the circuitry as designed stage. Nor do they describe methods for identifying high risk factors in circuit design data without having to first manufacture the ICs to reveal defects.

All three of U.S. Pat. Nos. 7,260,810, 7,346,470 and 7,752,581 are incorporated by reference into this description.

There is, therefore, a need for better approaches for identifying high risk factors in IC circuit designs during the circuitry as designed stage and spotlighting those high risk factors for faster and easier identification by designers.

SUMMARY OF THE INVENTION

The present invention solves the need to better assess electrical properties and correlate that information with design information for a semiconductor wafer by providing a method for improved display for analysis of integrated circuit parameters by extracting from circuitry as designed layout computer files selected electrical property values, annotating those values back into the circuitry as designed computer files, converting the annotated as designed computer files into a new computer file capable of being displayed as a graphic image where the selected electrical properties are superimposed onto corresponding physical layout locations of the integrated circuit. Human understandability of the graphic images is enhanced by color-coding potentially performance limiting values.

BRIEF DESCRIPTION OF THE DRAWINGS

The teachings of the present invention will be better understood from the accompanying drawings illustrating various aspects and example embodiments of the invention and its teachings.

DETAILED DESCRIPTION

The present invention measures key electrical and physical properties of integrated circuits, including performance and timing-critical paths, during the circuitry as designed stage. An ability to measure these parameters is critical to understanding, designing and building more effective, efficient and robust electronic devices from circuitry as specified designs. A goal of the present invention is to spotlight anomalies between circuitry as specified chip design and circuitry as designed physical layouts. The present invention achieves this by creating graphic images that reveal those key electrical and physical properties, and areas of potential defects, in a more human understandable manner. Any anomalies between circuitry as specified and circuitry as designed values help pinpoint areas of the circuitry to be further examined for their potential impact on functionality, performance, functional yield and performance yield.

Figure 1A:
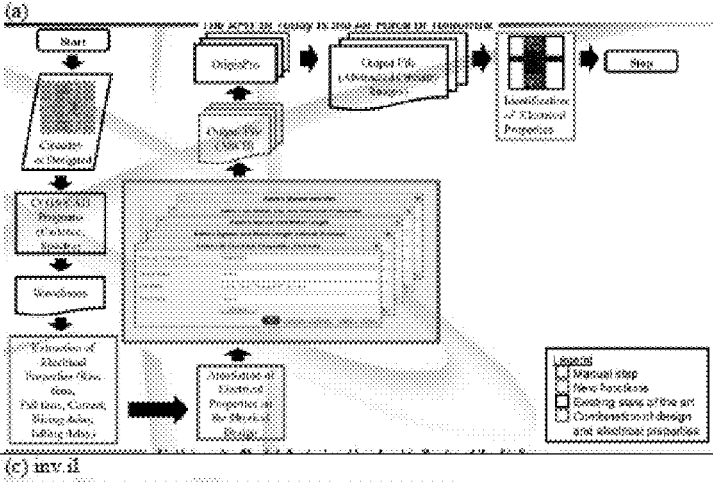
FIGS. 1a and 1b are a schematic representation of an example circuitry as designed process flow according to the teachings of the present invention compared to a prior art design methodology.
Figure 1B:
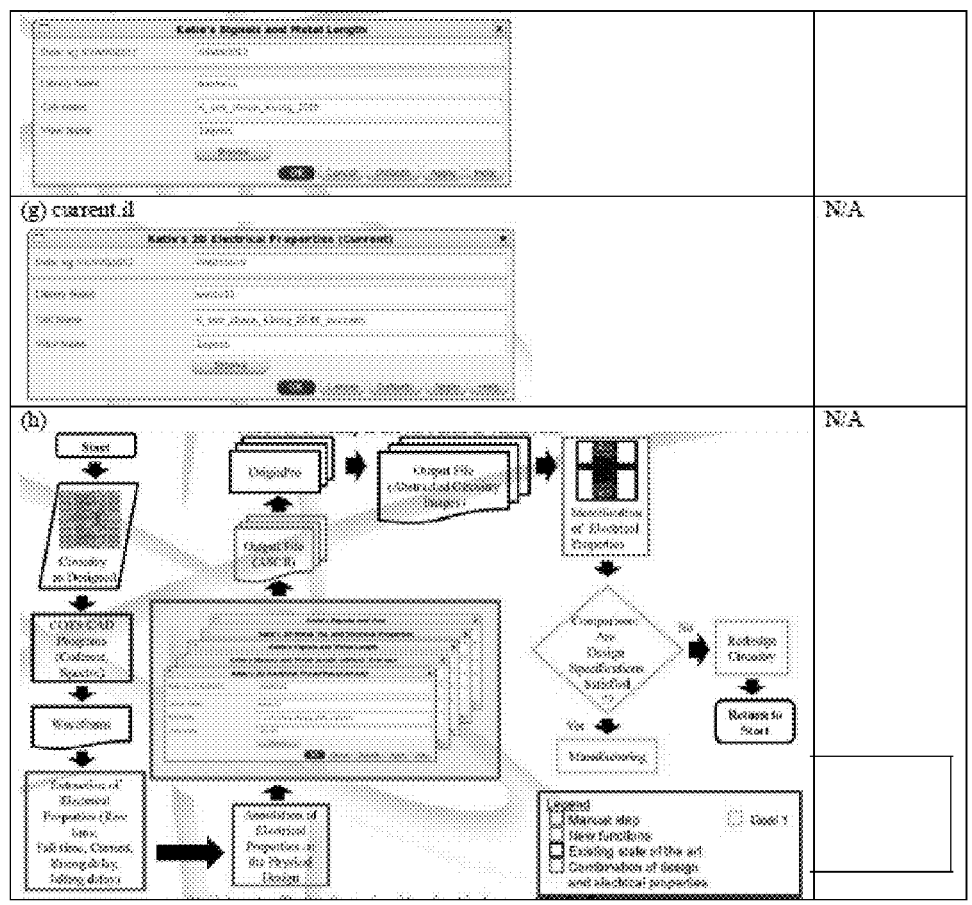

FIGS. 1a and 1b are a schematic representation of an example circuitry as designed process flow according to the teachings of the present invention compared to a prior art design methodology.

The FIGS. 1a-1b example embodiment of the invention are for a simple circuit and a modified version of the original circuit.

Circuitry as designed physical layout data, typically in a CADENCE GDS file format, is read by standard commercially available software to extract electrical properties corresponding to physical layout locations, and then manually annotated back into the original circuitry as designed file format.

Custom software creates an ASCII output file including virtual cells for corresponding electrical properties and physical design layout locations, where each cell, or combination of cells, can be viewed as image pixels. The custom software is written in the CADENCE tools programming language SKILL, an object-oriented language internal to CADENCE software. The new software functions are incorporated into existing CADENCE environments according to the steps illustrated in FIGS. 1a and 1b. Listings of the software used to demonstrate the invention are included with the cross-referenced related provisional application.

Commercially available software, such as ORIGINPRO, is then used to create images displaying those electrical properties superimposed on a physical layout image so that they can be more readily seen, and understood, Color-coding displayed electrical properties, particularly for spotlighting, or highlighting, potential defects, even more improves human understandability.

As shown in block (h) of FIG. 1b, electrical properties of as designed circuitry can now be more easily seen and compared to as specified circuitry to determine if a redesign is needed, before sending to a foundry for manufacture.

Similarly, electrical properties of as designed circuitry can be more easily compared to circuitry as manufactured test results to better determine, and better correct, defects in as manufactured circuitry.

The additional time required for applying these new computer-aided design tools for integrated circuit and circuit layout design, obtaining information that correlates electrical properties and physical design layouts, will provide important information about integrated circuitry not available through the standard process and can prevent expensive redesigns made after initial production begins.

FIGS. 2a-2d are a schematic representation of another example application of the teachings of the present invention to an example circuit, illustrating example steps for obtaining and displaying electrical properties of an integrated circuit.

Figure 2A:
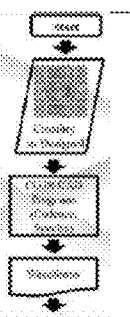
FIGS. 2a-2d are a schematic representation of an example application of the teachings of the present invention to an example circuit.
Figure 2B:
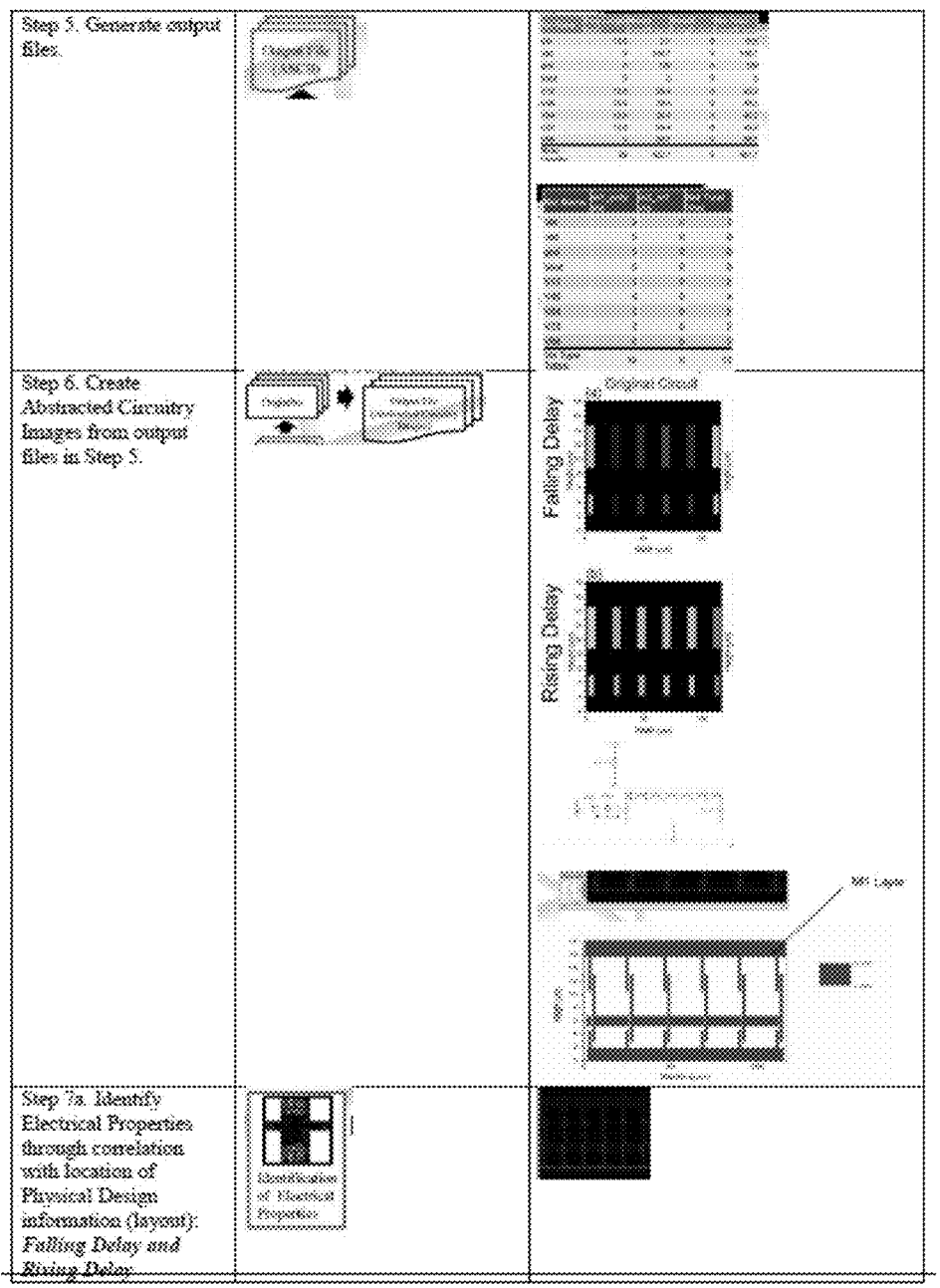
Figure 2C:
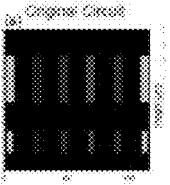
Figure 2D:
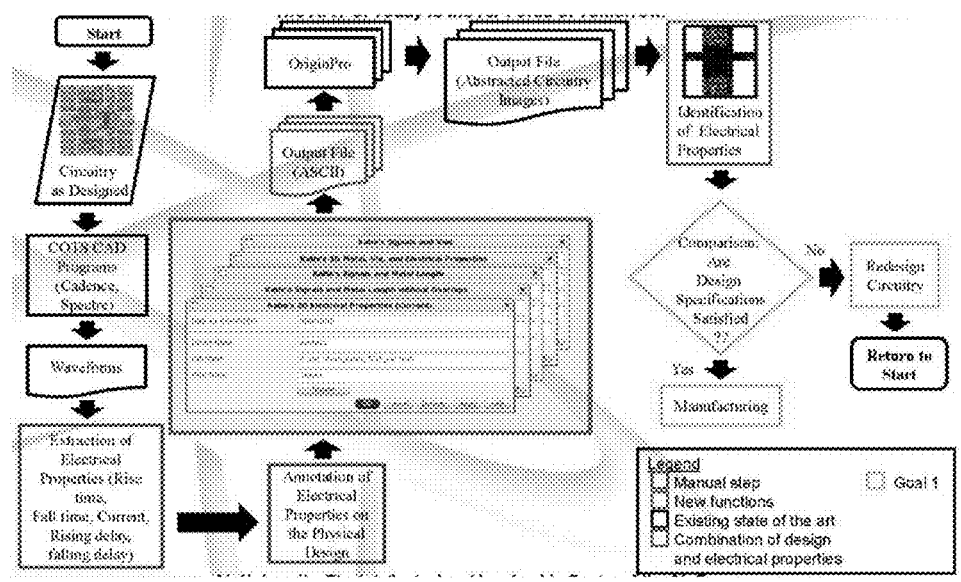

Steps 1 and 2 of FIG. 2a illustrate using standard software features, such as are available in CADENCE and SPECTRE software, to generate physical design layout files, typically in CADENCE GDS file format, and then determine and extract from those physical design data files corresponding electrical properties.

The example circuit used to demonstrate the invention is an inverter chain of six inverters, each with $\beta \sim 1$.

Extraction based timing on the layout produces path delays shown for the two input transitions (input rising and input falling). The layout is abstracted according to metal layer properties (length and via count) and pixel size of 0.1 μm×0.1 μm.

The extracted electrical properties in this example embodiment are:
 (i) Rising delay and falling delay
 (ii) Path delays
   Path 1 (input rising)
   Path 2 (input falling)
   Differences between Path Delay for Paths 1 and 2
 (iii) Path slews (rise time, fall time)
   Path 1 (input rising)
   Path 2 (input falling)
 (iv) Current
   Peak current
   Average current Step 3 represents annotating electrical properties on the as designed circuitry physical layout computer file layouts. Electrical properties are not easily annotated on each of the layer shapes in the physical design. Annotation can be done by hand for each value of the electrical properties and for each layer involved in each signal (with the associated electrical properties). Custom software can also be written to perform the annotation.

Step 4 represents using custom software written in SKILL to extract the thus annotated electrical properties and create ASCII files suitable for conversion to a graphical image.

The ASCII files generated in Step 5 contain information about the electrical properties (risetime, falltime, path delay for input rising transition, path delay for input falling transition, average current, peak current) as a function of corresponding physical design layout locations. The ASCII files contain the values of the electrical properties at each physical location in the design over the size of the layout. For converting to a graphic image, the values are represented as "cells" which can correspond to individual pixels in a graphic image. For this example, the pixel size is chosen to be 0.1 μm×0.1 μm.

Step 6 represents processing of the ASCII output files using a program such as ORIGINPRO to produce image files.

In step 7, the images are superimposed on the physical design layout. It is important that the images are registered over the physical design layout with the same resolution as the images containing the physical design layout images.

Steps 7a-7e represent showing the images of electrical properties over the physical design layout for: (a) falling delay and rising delay; (b) path delays; (c) fall time and rise time; (d) peak current; and, (e) average current.

Figure 3A:
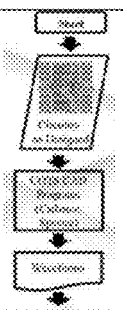
FIGS. 3a-3c are a schematic representation of another example application of the teachings of the present invention comparing electrical properties of an example circuit to electrical properties of a modified example circuit.
Figure 3B:
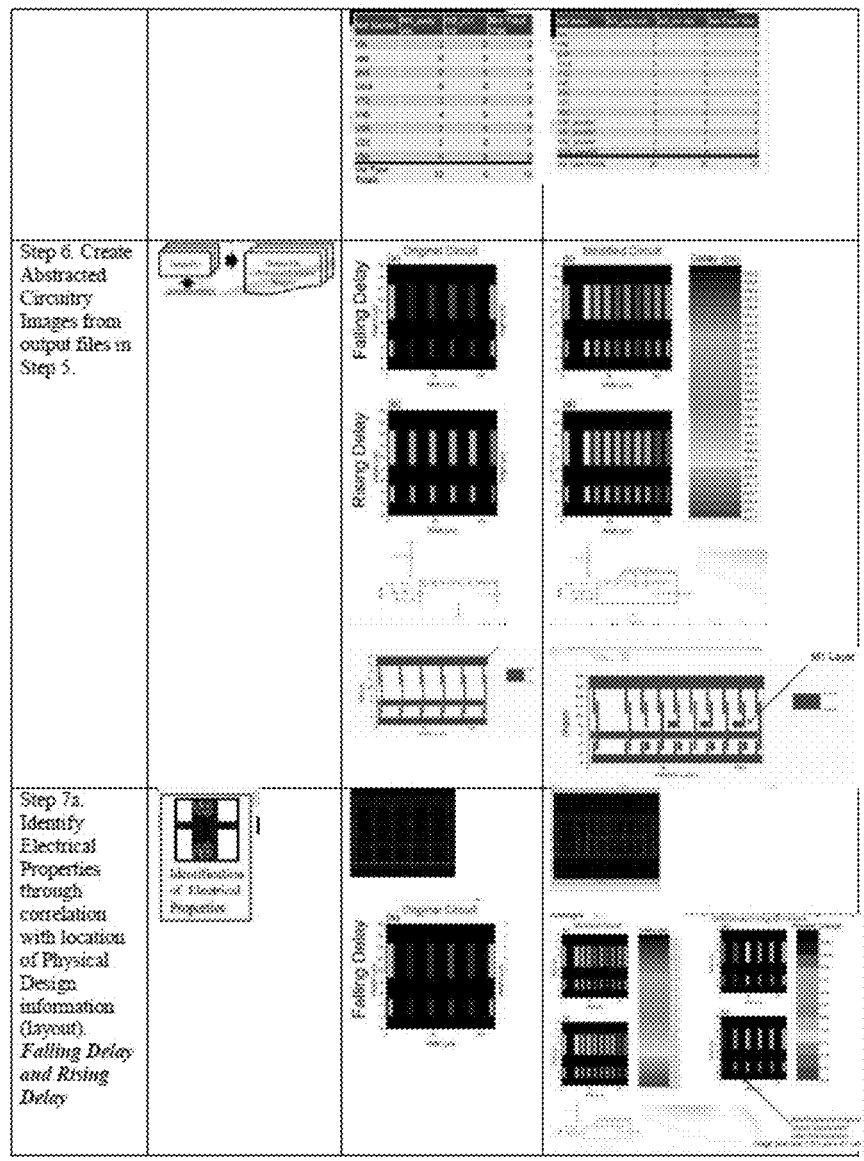
Figure 3C:

FIGS. 3a-3c are a schematic representation of an example application of the teachings of the present invention comparing electrical properties of an example circuit to electrical properties of a modified example circuit.

The invention quantifies the electrical characteristics and correlates these characteristics with the physical design layout, providing values for electrical properties that are different if the circuitry is modified from the original circuitry design.

Similar to the description for FIGS. 2a-2d, step 1 in FIG. 3a illustrates creation of a physical design layout and schematic by a standard design methodology using commercial CAD programs to generate waveforms.

Step 2 illustrates extracting electrical properties and step 3 illustrates annotating the electrical properties onto the physical design.

Steps 4 and 5 extract the annotated electrical properties as virtual cells in an ASCII output file where each cell includes corresponding physical locations and electrical properties at that physical location.

Step 6 creates as designed circuitry images from the ASCII output file using commercially available software such as ORIGINPRO.

The steps 7a through 7e images show the electrical properties superimposed on the as designed circuitry physical layouts. Steps 7a through 7e show, respectively: (7a) Falling Delay and Rising Delay; (7b) Path Delays; (7c) Fall Time and Rise Time; (7d) Peak Current; and (7e) Average Current.

Each image allows comparing the electrical properties of an original as designed circuitry to a modified as designed circuitry. As described earlier, it is important that the images are registered over the physical design layout with the same resolution as the images containing the physical design layout images.

The present invention can also be used to visually display potential defect information, such as may be determined using the teachings of the two referenced Lanzerotti et al. patents.

The present invention is not limited to displaying electrical characteristics that can be extracted by CADENCE and SPECTRE software, but can also display, for example, electrical characteristics identified at the transistor level, and then mapped to design shapes.

The new method can also be used to quickly test for counterfeit integrated circuit chips by providing visual images of electrical properties from an authentic original circuitry as designed computer file for comparing against electrical properties from as tested suspect integrated circuit chips. The new method can also be used to more easily duplicate and better understand the changes in known counterfeit chips.

Various other modifications to the invention as described may be made, as might occur to one with skill in the art of the invention, within the scope of the claims. Therefore, not all contemplated example embodiments have been shown in complete detail. Other embodiments may be developed without departing from the spirit of the invention or from the scope of the claims.

I claim:

1. A method for improved display for analysis of integrated circuit layout parameters, comprising the steps of:
   (a) receiving a circuitry as designed layout in a first digital format;
   (b) extracting from the circuitry as designed layout in the first digital format values for a selected electrical property at a corresponding plurality of locations on the circuitry as designed layout;
   (c) annotating the extracted values of the selected electrical property into the first digital format of the first circuitry as designed layout;
   (d) identifying performance limiting extracted values according to selected criteria;
   (e) converting the circuitry as designed layout from the first digital format to a second digital format capable of visual display;
   (f) visually displaying in a color-coded format only the performance limiting extracted and annotated values in the second digital format; and
   (g) wherein converting the circuitry as designed layout from the first digital format to a second digital format capable of visual display comprises the steps of:
      (i) generating from the annotated first digital format a second digital format, comprising an ASCII file representing a two dimensional grid of electrical property values and corresponding physical layout locations; and,
      (ii) creating from the second digital format a third digital format, comprising a raster image of performance limiting electrical property values superimposed on corresponding physical locations of the circuitry as designed layout.

2. The method for improved display for analysis of integrated circuit layout parameters according to claim 1, wherein the selected electrical property is selected from electrical properties consisting of path delay times, rising delay times, falling delay times, overall slack for AC signal paths, peak current and average current.

* * * * *